United States Patent [19]
Houston

[11] Patent Number: 5,396,110
[45] Date of Patent: Mar. 7, 1995

[54] PULSE GENERATOR CIRCUIT AND METHOD

[75] Inventor: Theodore W. Houston, Richardson, Tex.

[73] Assignee: Texas Instruments Incorporated, Dallas, Tex.

[21] Appl. No.: 117,262

[22] Filed: Sep. 3, 1993

[51] Int. Cl.6 .............. H03K 17/28; H03K 19/21; H03K 7/00
[52] U.S. Cl. .................. 327/172; 327/263; 327/294
[58] Field of Search .............. 307/260, 265, 268, 254, 307/443, 520, 521; 328/111, 55

[56] References Cited
U.S. PATENT DOCUMENTS

| | | | |
|---|---|---|---|
| 3,835,336 | 9/1974 | Block | 328/111 |
| 4,061,975 | 12/1977 | Sugai | 307/234 |
| 4,583,008 | 4/1986 | Grugett | 307/265 |
| 5,055,706 | 10/1991 | Nakai et al. | 307/265 |
| 5,103,114 | 4/1992 | Fitch | 307/234 |
| 5,198,719 | 3/1993 | Houston | 307/520 |

Primary Examiner—William L. Sikes
Assistant Examiner—Fetsum Abraham
Attorney, Agent, or Firm—Ira S. Matsil; James C. Kesterson; Richard L. Donaldson

[57] ABSTRACT

A pulse generator circuit 20 is disclosed herein. An asymmetric delay element 22 is coupled to one of the inputs of a logic element 24, such as a NAND gate. For the asymmetric delay 22, the time to propagate a transition from a high level to a low level is different then the time to propagate a transition from a low level to a high level. The input of the asymmetric delay element 22 is coupled to another of the inputs of the logic gate 24. The pulse generator circuit 20 of the present invention generates a pulse at its output OUT when a signal applied to its input IN transitions from a first signal level to a second signal level.

13 Claims, 8 Drawing Sheets

PULSE GENERATOR CIRCUIT AND METHOD

FIELD OF THE INVENTION

This invention relates in general to electronic circuits and more specifically to a circuit and method for generating a pulse at the rising or falling edge of an input signal.

BACKGROUND OF THE INVENTION

A pulse generator circuit is used in many electronic device application. For example, a pulse generator circuit may be designed to generate a pulse of a predetermined time duration at the rising edge of an input pulse. Alternatively, the circuit may be designed to generate a pulse at the falling edge of an input pulse.

An example of a prior art pulse generator 10 is shown in FIG. 1. An inverting delay circuit 12 has an output which is coupled to one of the inputs of NAND gate 14. The input pulse IN is coupled to the input of the delay circuit 12 and also to the second input of NAND gate 14.

When the input signal IN changes from a low level to a high level (i.e., at a rising edge), the out pulse signal OUT will go from high to low and remain there for the amount of time it takes to propagate the high level IN signal through delay circuit 12 and to node A. When the high signal IN reaches node A (a low level since the circuit 12 is an inverting delay), the output signal OUT will return to a high level. The timing diagram of FIG. 2 illustrates the operation of the prior art circuit.

SUMMARY OF THE INVENTION

Other objects and advantages will be obvious, and will in part appear hereinafter and will be accomplished by the present invention which provides a circuit and method for generating a pulse at the rising or falling edge of an input signal.

A pulse generator circuit is disclosed herein. An asymmetric delay element is coupled to one of the inputs of a logic element, such as a NAND gate. For the asymmetric delay, the time to propagate a transition from a high level to a low level is different than the time to propagate a transition from a low level to a high level. The input of the asymmetric delay element is coupled to another of the inputs of the logic gate. The pulse generator circuit of the present invention generates a pulse at its output when a signal applied to its input transitions from a first signal level to a second signal level. In an alternate embodiment a delay element is included between the asymmetric delay and the logic element.

An advantage of the present invention is that the required time between pulses generated by the pulse generator is minimized. The "dead time" which has been discovered to exist with prior circuits can be avoided or at least minimized.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The following is a description of the apparatus and method of the present invention. A problem discovered with the circuit of prior art FIG. 1 will first be described. Embodiments of the present invention which solve these problems will then be described along with modifications.

Figure 1:
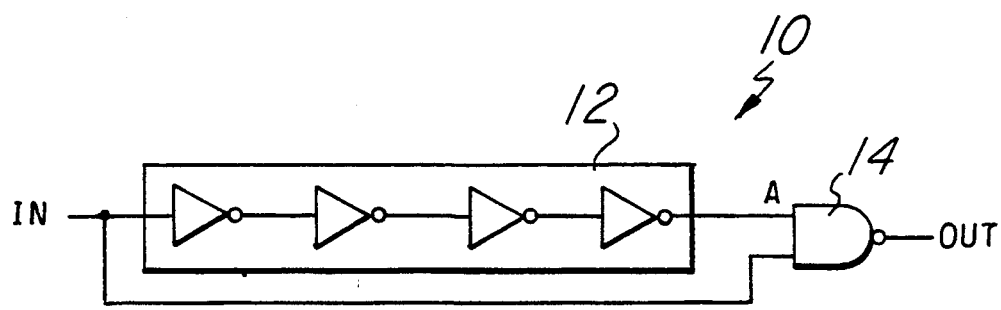
FIG. 1 is a schematic diagram of a prior art pulse generator circuit.
Figure 2:
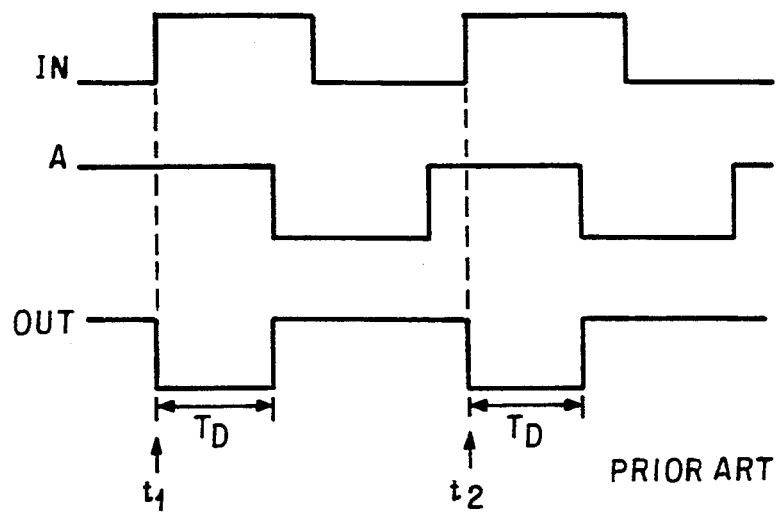
FIG. 2 is a timing diagram of the proper operation of the pulse generator circuit of FIG. 1.

A prior art pulse generator circuit 10 is illustrated in FIG. 1. During ideal operation, the circuit of FIG. 1 will generate a pulse of predetermined duration at the rising edge of an input signal. The operation of the circuit of FIG. 1 as it was designed to operate can be understood with reference to the timing diagrams of FIG. 2. At time $t_1$, the input signal IN goes from a low logic level to a high logic level (i.e., a rising edge). At the same time (neglecting the delay of NAND gate 14), the output signal OUT goes from high to low where it will remain for the delay $T_D$ of delay circuit 12. At time $t_2$, the process is repeated.

However, a problem with the prior art circuit of FIG. 1 has been discovered and will be described with reference to the timing diagram of FIG. 3.

Figure 3:
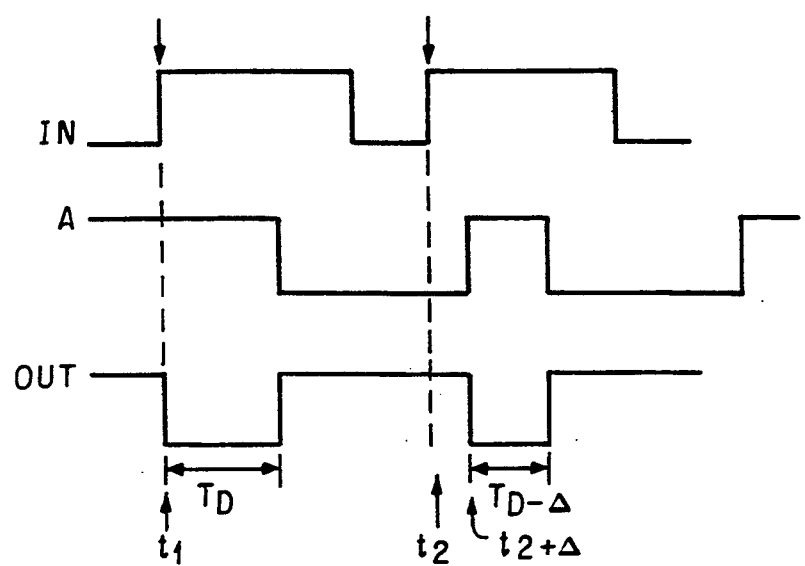
FIG. 3 is a timing diagram illustrating a problem discovered with the pulse generator circuit of FIG. 1.

As illustrated in FIG. 3, the input pulse IN has a duty cycle different than 50%. At time $t_1$, the input pulse IN experiences a rising edge and a pulse is generated at the output pulse OUT. However, the prior art pulse generator circuit 10 has some "reset time" after the falling edge of the input pulse IN before a new output pulse can be generated. In this example, the circuit detects a rising edge in the input pulse when the voltage at node IN is low and the voltage at node A is high. If the circuit has not reached this stable state (e.g., because a pulse is propagating through delay 12), the circuit will not operate correctly. In this patent, the reset time is defined as the time from when input signal IN goes low until the circuit has stabilized to its stable state (e.g., IN is low and A is high). As will become clear, the logic can also be designed to detect a falling edge pulse which will change some of the logic levels in this example.

In this example, the input pulse IN experiences a rising edge at time $t_2$ but the output pulse is not generated until time $t_2+\Delta$. The delay from $t_2$ to $t_2+\Delta$ (i.e., the time $\Delta$) is due to the rising edge of IN occurring while A is still low from the previous transition of IN. The "reset time" is the time from the falling edge of IN to the rise of A. This dead time undesirably delays the initiation of the succeeding output pulse.

To further compound the problem, the duration of the delayed output pulse is shorter. In this example, the desired duration is $T_D$ but the actual duration of the second output is $T_D-\Delta$. This situation can cause problems in circuits where the input signal IN is an enable signal which enables an operation which occurs during the time when the output signal OUT is low. If this operation takes longer than $T_D-\Delta$ seconds, then it will be disabled before it is completed.

The circuits of the present invention substantially solve the problem which has been discovered with the prior art circuit. Other advantages are also gained by these novel circuits.

Figure 4:
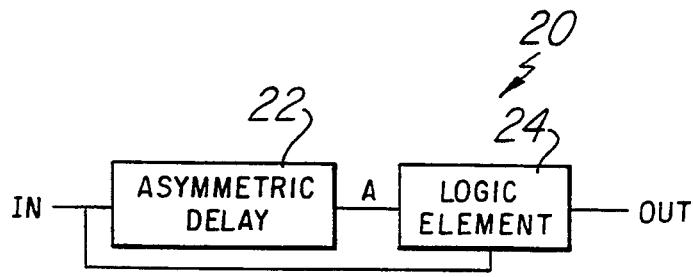
FIG. 4 is a block diagram of a preferred embodiment pulse generator circuit.

Referring now to FIG. 4, a first embodiment of the present invention is illustrated. The pulse generator 20 comprises an asymmetric inverting delay element 22 and logic gate 24. The asymmetry of element 22 is such that an input transition from high to low propagates with a different delay than does an input transition from low to high. The input signal IN is coupled to the input of the asymmetric delay element 22 and also to a first input of logic gate 24. The output of asymmetric delay element 22 is coupled to the second input of logic gate 24. The output pulse OUT is taken from the output of logic gate 24.

The logic element 24 may comprise logic elements such as a NOR, AND, OR, XOR or NXOR gate. For a pulse on the rising edge, the asymmetrical delay should be an inverting delay faster for input falling than for input rising, and the preferred logic element 24 should be a NAND or an AND gate. For a pulse on a falling edge, the asymmetrical delay should be an inverting delay faster for input rising than for input falling, and the logic element 24 should preferably be a NOR or an OR gate. A NXOR or XOR gate would give a pulse, if the delay is non-inverting, for either a rising or falling input with the asymmetry making one delay longer than the other.

The asymmetric delay element 22 is an element where the time to propagate a transition from a high level to a low level is different than the time to propagate a transition from a low level to a high level.

Figure 5:
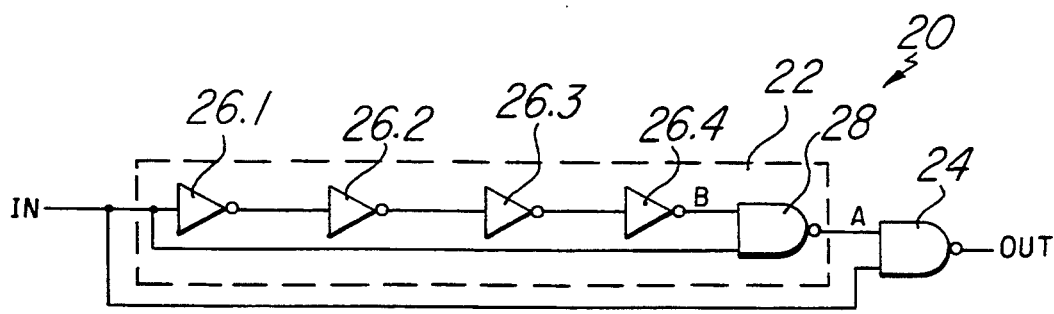
FIG. 5 is a schematic diagram of an implementation of the preferred embodiment pulse generator circuit of FIG. 4.

FIG. 5 illustrates a pulse generator 20 with a preferred embodiment asymmetric delay element 22. In this figure, the logic element 24 is a NAND gate.

The asymmetric delay element 22 illustrated in FIG. 5 includes a non-inverting delay 26 and a logic gate 28. In this embodiment, the logic gate 28 is a NAND gate and the non-inverting delay 26 comprises an even number of inverters 26.1-26.4 coupled serially. Although illustrated with four inverters, any even number of inverters may be used. Alternatively, other non-inverting delay elements may be used. For example, a capacitor (not shown) can be coupled between the input and output of any, some or all of the inverters 26.

The use of an asymmetric delay 22 will help reduce the dead time of the pulse generator 20. The recovery of node A is now fast. However, since node B is delayed, a change in the input signal IN before node B recovers will not give a full output pulse. In systems where this timing situation may occur, the circuit of FIG. 6 may be used.

Figure 6:
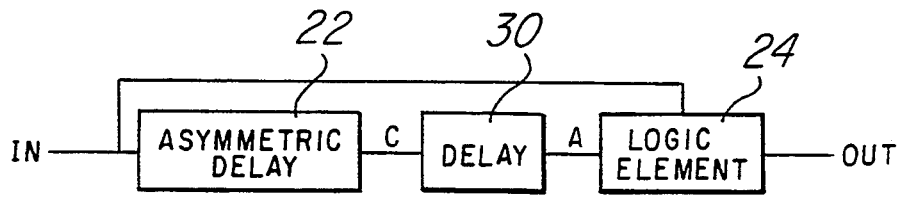
FIG. 6 is a block diagram of an alternate embodiment pulse generator circuit.

Referring now to FIG. 6, the input signal IN is coupled to the input of an inverting asymmetric delay element 22 and also to a first input of logic gate 24. The output of asymmetric delay element 22 is coupled to the input of non-inverting delay element 30. The output of delay element 30 is coupled to a second input of logic element 24.

Figure 7:
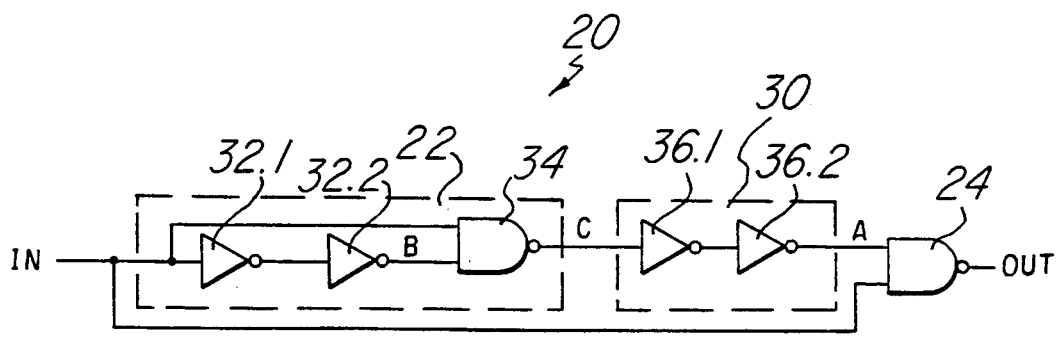
FIG. 7 is a schematic diagram of an implementation of the pulse generator circuit of FIG. 6.

A preferred implementation of the circuit of FIG. 6 is illustrated in FIG. 7. In this embodiment, the asymmetric delay 22 comprises a non-inverting delay comprising inverters 32.1 and 32.2, and a logic gate 34 comprising a NAND gate. In other embodiments, a different delay element 32 and/or logic gate 34 can be utilized. In this example, the logic element 24 is a NAND gate. Alternatively, the logic element 24 may be a NOR, OR or AND gate, as examples.

In this embodiment, the delay 30 is a non-inverting delay comprising, for example, an even number of inverters 36 coupled in series. Other types of delays can also be used. As will be discussed with reference to FIG. 8, the delay 30 may comprise an asymmetric delay. Once again, the logic element 24 may comprise a variety of logic gates including NAND, AND, NOR or OR gates.

The circuits illustrated in FIG. 6 and 7 provide a pulse generator which reduces the reset time. Once the reset time has elapsed, a rise in input signal IN will generate a correct pulse at output signal OUT.

Figure 8:
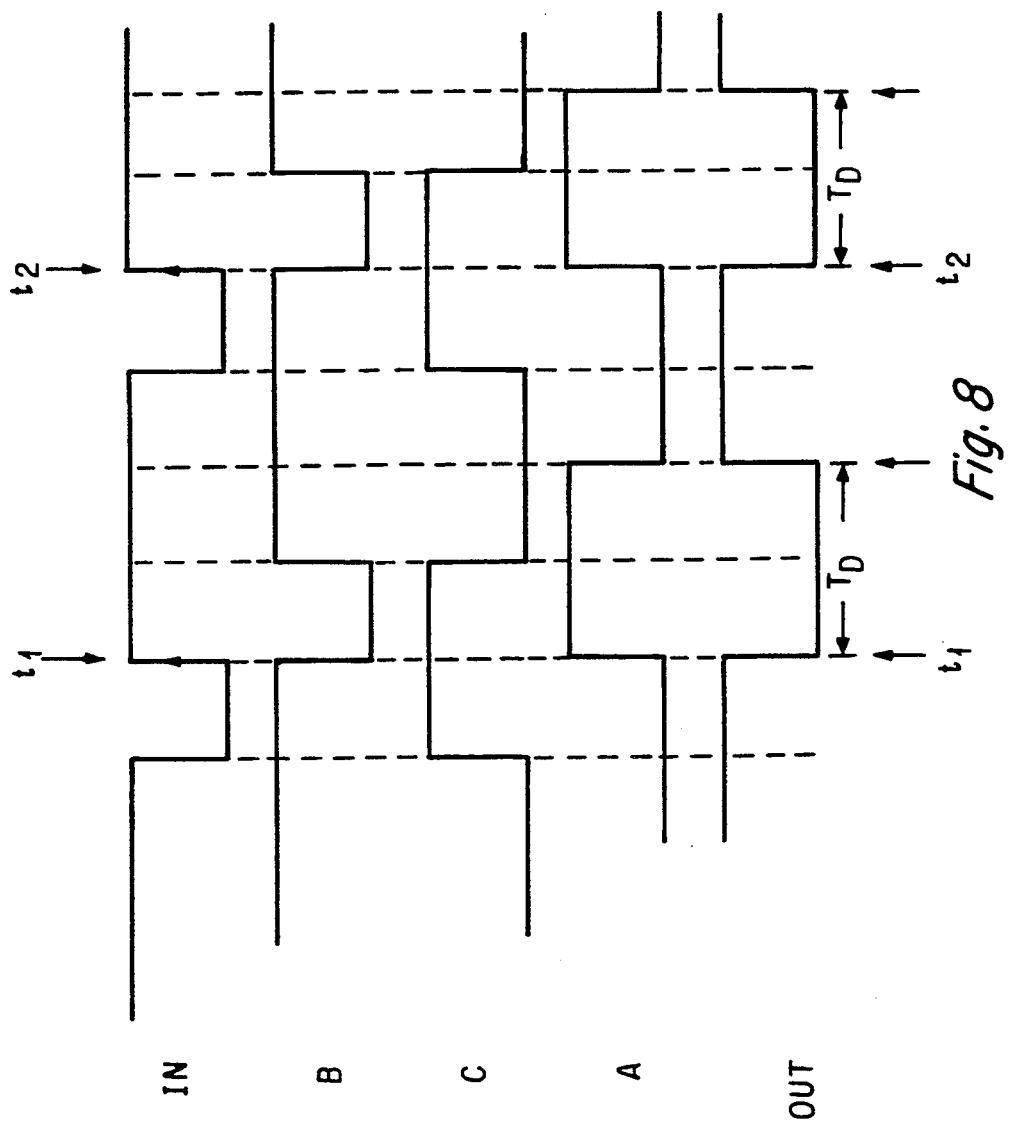
FIGS. 8 and 9 are timing diagrams illustrating the operation of the pulse generator circuit of FIG. 7.
Figure 9:
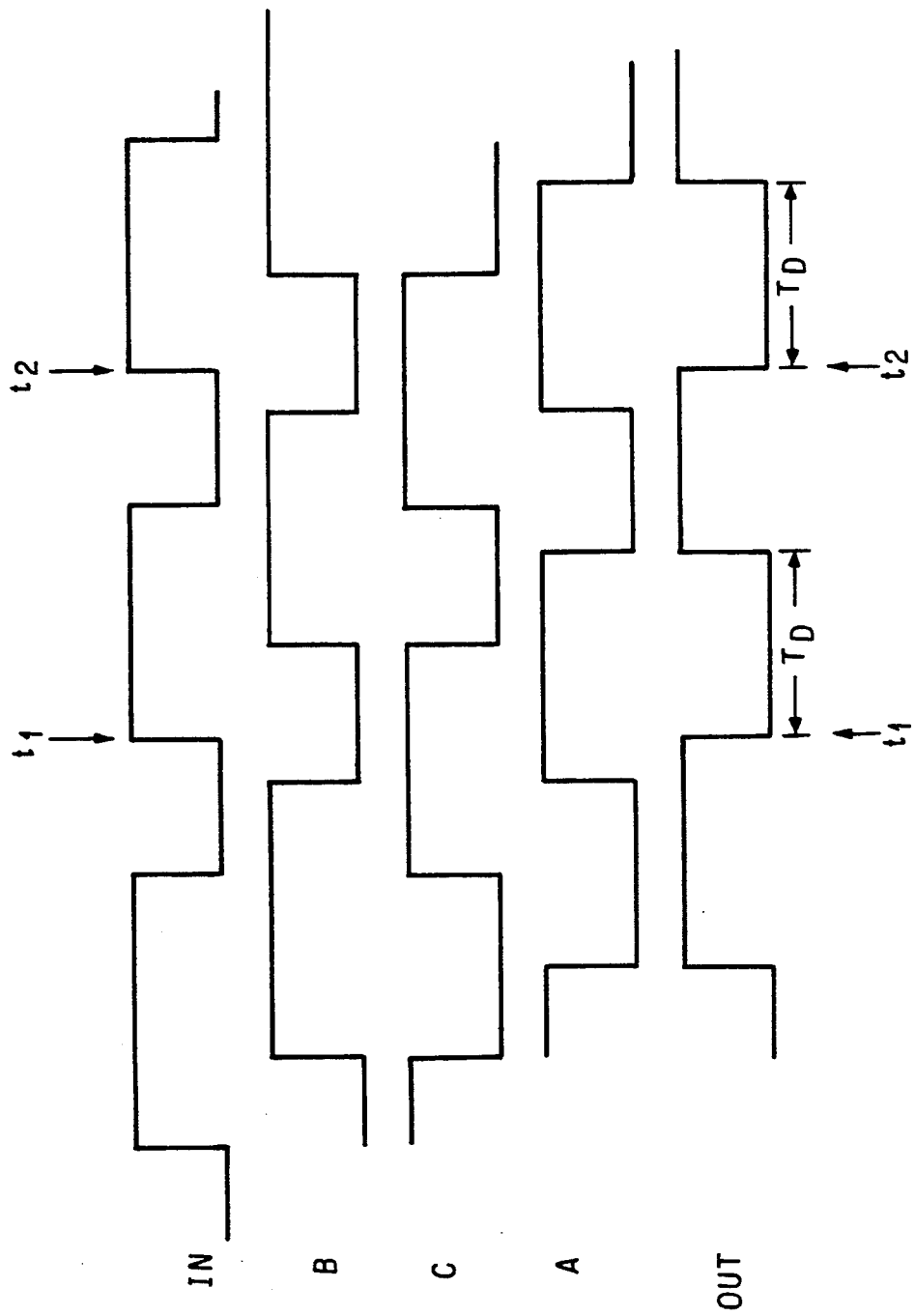

The operation of the circuit of FIG. 7 for two different input pulses is illustrated in FIGS. 8 and 9. The input signal IN is the signal which is applied to the pulse generator 20. The intermediate signal B is a non-inverted delayed version of the input signal IN. In this case, the delay of delay element 32 is the same as the delay of the delay element 30 and the sum of these delays is $T_D$. However, the delays do not have to be equal (i.e., the delay of element 30 can be greater or less than the delay of element 32). In these plots, the delays generated by logic elements 34 and 22 have been neglected.

The intermediate signal C is a NANDed version of IN and B. In other words, the signal C will be high unless both IN and B are high at which time C will be low. The intermediate signal A is a non-inverted delayed version of signal C. This signal A along with the input signal IN are NANDed to generate the output signal OUT.

In the examples of both FIG. 8 and FIG. 9, the input signal IN goes from a low level to a high level at time $t_1$. In response, the output signal OUT goes from high to low and remains there for $T_D$ seconds. At time $t_2$, the input signal IN once again goes from high to low and once again a low going pulse of $T_D$ seconds is generated.

The circuit of FIG. 7 effectively operates to reduce the reset time, in this case in half. In this case, the circuit operates properly when the input node IN is at a low logic level and the node C and A are at a high logic level. As an advantage over prior art circuits, this stable state will return twice as fast (if delay 32 is equal to delay 36) as with the circuit of FIG. 1. This advantages occurs because the node C is immediately driven high when the input signal IN returns to a low level. At this point, the pulse will propagate simultaneously through delays 32 and 36, thereby reaching the stable state much more quickly.

Figure 10:
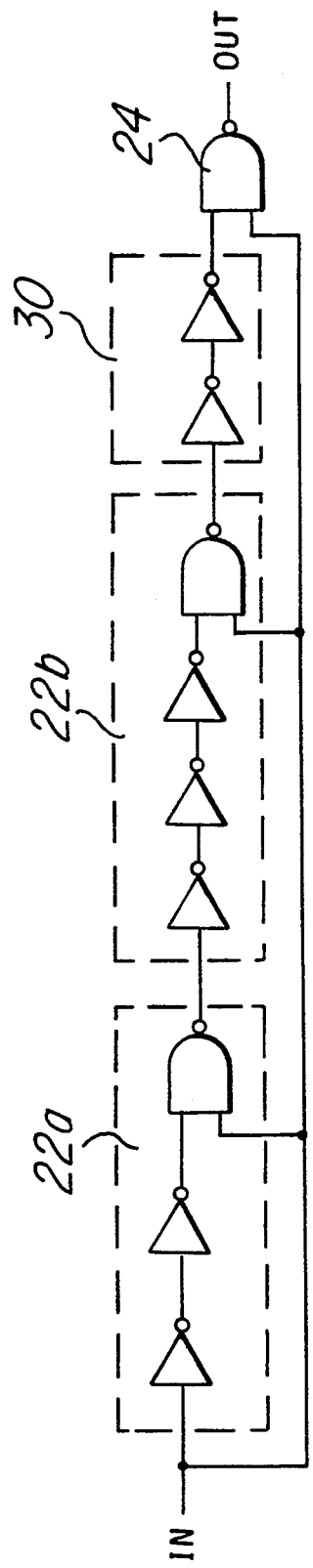
FIGS. 10, 11, 12, 13, 14, 15, 16 and 17 are schematic diagrams of alternate embodiment pulse generator circuits.

The circuit of FIG. 7 can reduce the reset by a factor of two by having the pulse propagate through the two delay elements 32 and 30 simultaneously. This concept can be expanded to a larger number of branches. For example, FIG. 10 illustrates a circuit which includes two asymmetric delay elements 22a and 22b as well as delay element 30. Assuming the delays through each of these elements is equal, the reset time will be one third the reset time of the prior art circuit of FIG. 1. It is noted that delay 22a is an inverting delay while delay 22b is a non-inverting delay.

Figure 11:
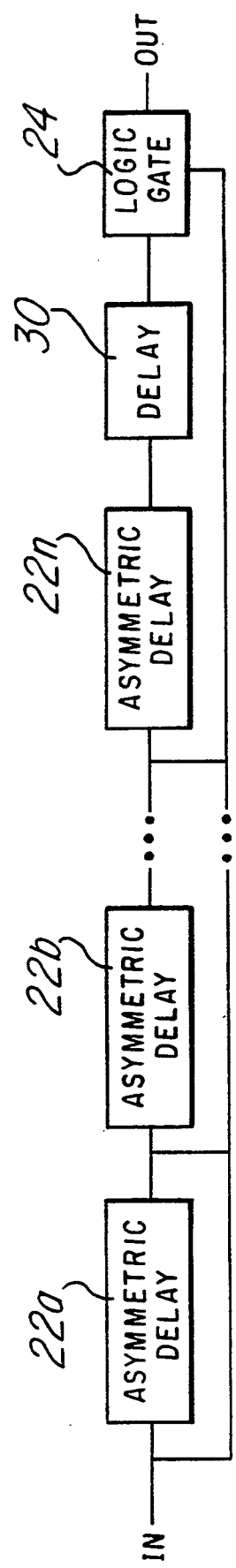

This concept can be expanded to any number of asymmetric delays as illustrated in FIG. 11. In general, if n+1 delays of equal duration (asymmetric delays 22a–22n and delay 30) are used, then the reset time will be 1/n+1 seconds. Therefore, the ideal circuit, operation-wise, would have a very large number of asymmetric delays 22, each with a short delay. Each of these delays, however, will require surface area on the chip. Therefore, a design tradeoff must be made between circuit size and reset time.

Figure 12:
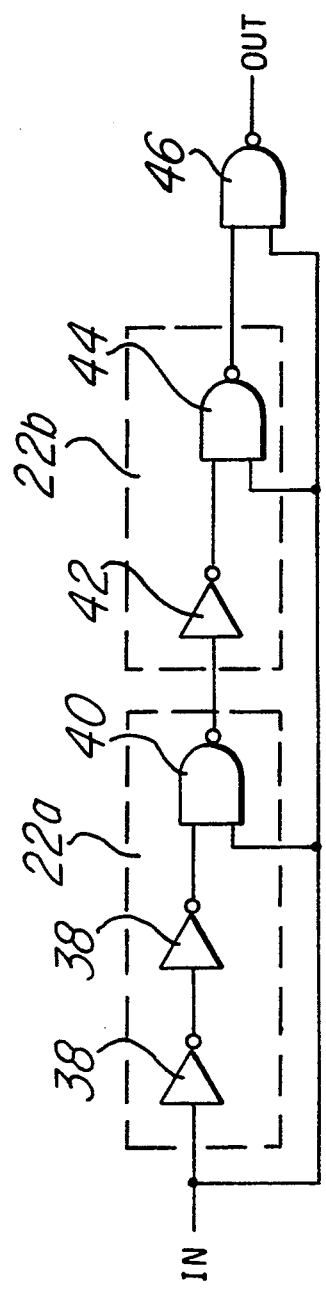

FIG. 12 illustrates an alternate embodiment which includes inverting asymmetric delay 22a and non-inverting asymmetric delay 22b.

The input node IN is coupled to the input of delay element 38, and one of the inputs of logic elements 40, 44 and 46. The output of delay element 38 is coupled to a second input of logic element 40 while the output of logic element 40 is coupled to the input of inverter 42. The output of inverter 42 is coupled to a second input of logic element 44 which has an output coupled to a second input of logic element 46.

In the embodiment illustrated in FIG. 12, the delay element 38 comprises an even number of serially coupled inverters. Each of the logic elements 40, 44 and 46 comprise NAND gates. The total delay through inverters 38 and 42 as well as NAND gates 40 and 44 should be equal to the desired width $T_D$ of the generated pulse.

Figure 13:
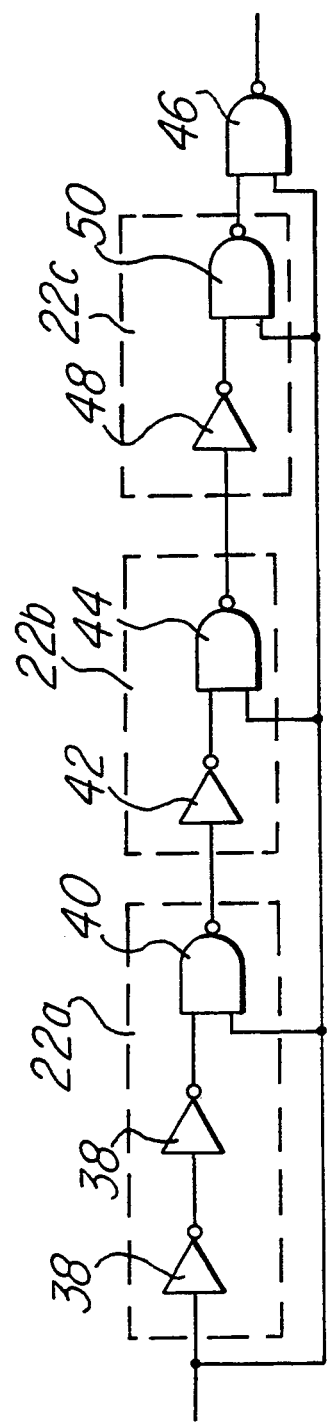
Figure 14:
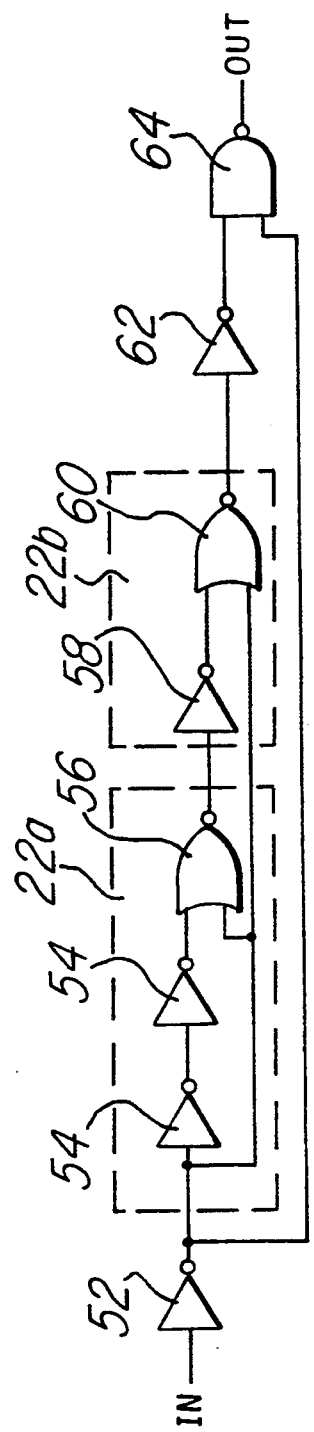

The circuit of FIG. 13 is similar to that of FIG. 12 with the addition of another stage including inverter 48 and logic element 50. FIG. 14 is provided to demonstrate that, once again, additional stages of the asymmetric delay may be provided. In this case, the total delay through inverters 38, 42 and 48 as well as through NAND gates 40, 44 and 50 should be equal to the desired width $T_D$ of the generated pulse. The additional stages allow a greater ratio of total delay $T_D$ to the reset time.

FIG. 14 illustrates an alternate embodiment circuit which utilizes NOR gates 56 and 60. The input signal IN is coupled to the input of inverter 52 as well as NAND gate 64. The output of inverter 52 is coupled to the input of delay element 54 as well as inputs of NOR gates 56 and 60. The output of delay element 54 is coupled to a second input of NOR gate 56. The output of NOR gate 56 is coupled to the input of inverter 58 which has an output coupled to a second input of NOR gate 60. The output of NOR gate 60 is coupled to the input of inverter 62. The output of inverter 62 is coupled to a second input of NAND gate 64.

The circuits of the present invention can be generalized to use different delay elements 26, 30 and or 32. In addition, (or alternatively), the logic element 24 may comprise a NOR circuit. When logic element 24 is a NOR gate, a positive going pulse is generated upon a falling edge of input signal IN. More elements can be used in modified embodiments.

Figure 15:
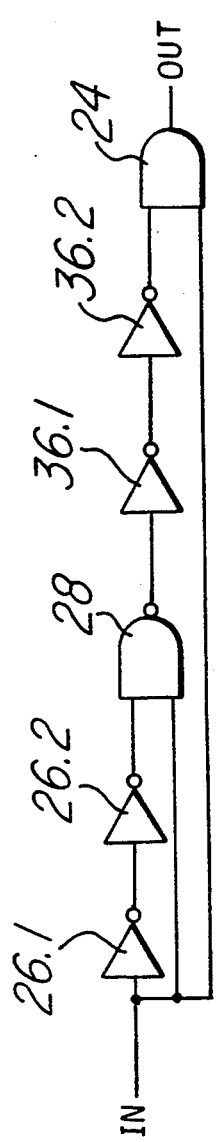
Figure 16:
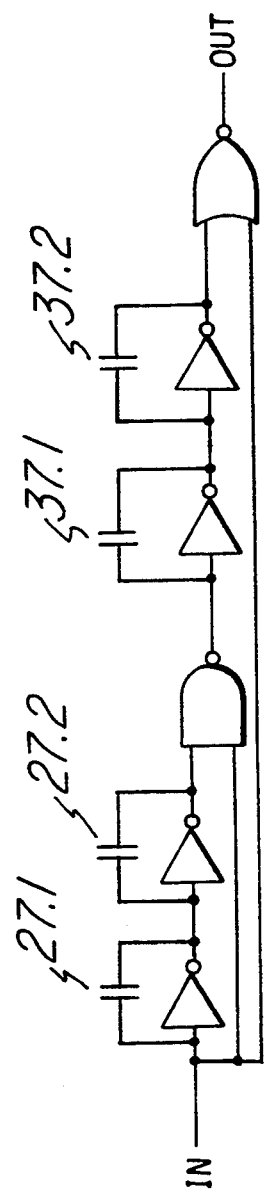
Figure 17:
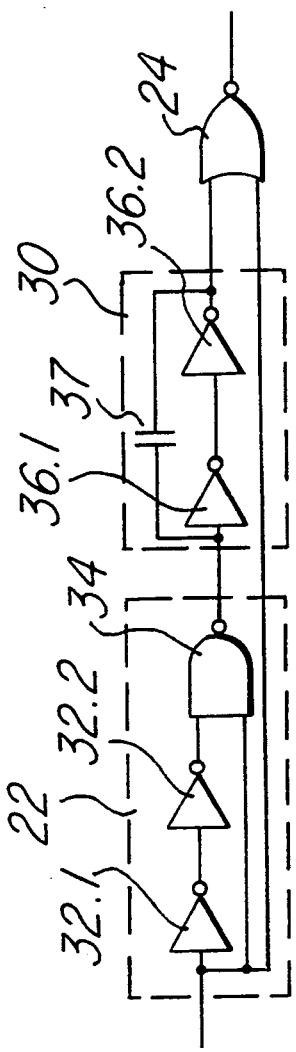

FIGS. 15–17 illustrate just a sample of the many variations of circuits which may be used. In FIG. 15, the logic element 24 is an AND gate. In FIG. 16, the delay portion of asymmetrical delay 22 includes capacitors 27.1 and 27.2 coupled in parallel to inverters 26.1 and 26.2, respectively. Also in FIG. 16, the logic element 24 is a NOR gate. In FIG. 17, the non-inverting delay 30 includes capacitor 37 and logic element 24 is an OR gate.

FIGS. 15–17 are included to demonstrate the numerous embodiments which can be derived from the general circuit of FIG. 6. Similar modifications can be made to the circuits of the other figures.

The pulse generator of the present invention can be used in a variety of applications. One example is an SRAM (static random access memory) circuit which uses the write-enable input to generate a pulse to control the write operation internally. With prior art pulse generators, a problem may occur when the control pulse is wide. If the external signal does not have a long enough disable time in the cycle, the subsequent internal write pulse is delayed. The circuit of the present invention substantially solves this problem.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pulse generator circuit having an input and an output consisting of:
   an asymmetric delay element wherein the time to propagate a transition from a high level to a low level is different then the time to propagate a transition from a low level to a high level, said asymmetric delay element having an input and an output, said asymmetric delay input comprising said pulse generator circuit input; and
   a logic element including first and second inputs and an output, wherein the input of said asymmetric delay element is coupled to said first logic gate input and the output of said asymmetric delay element is coupled to said second logic gate input, said logic gate output comprising said pulse generator circuit output;
   wherein said pulse generator circuit generates a pulse at said output when a signal applied to said input transitions from a first signal level to a second signal level but not when said input transitions from said second signal level to said first level.

2. The circuit of claim 1 wherein said asymmetric delay comprises:
   a delay element having an input and an output, the input of said delay element coupled to said asymmetric delay input; and
   a second logic gate having first and second inputs wherein the input of said delay element is coupled to said first input and the output of said delay element is coupled to said second input.

3. The circuit of claim 2 wherein said second logic gate comprises a NAND gate.

4. The circuit of claim 3 wherein said delay element comprises a non-inverting delay element.

5. The circuit of claim 1 wherein said logic element comprises a NAND gate.

6. The circuit of claim 1 wherein said logic element comprises a NOR gate.

7. The circuit of claim 1 wherein said first signal level comprises a low logic level and said second signal level comprises a high logic level.

8. The circuit of claim 1 wherein said first signal level comprises a high logic level and said second signal level comprises a low logic level.

9. A pulse generator circuit having an input and an output consisting of:
   an asymmetric delay element wherein the time to propagate a transition from a high level to a low level is different then the time to propagate a transition from a low level to a high level, said asymmetric delay element having an input and an output, said asymmetric delay input comprising said pulse generator circuit input;
   a non-inverting delay element having an input and an output wherein the input of said delay element is coupled to the output of said asymmetric delay element;
   a logic element including first and second inputs and an output, wherein the input of said asymmetric delay element is coupled to said first logic gate input and the output of said delay element is coupled to the second input of said logic gate, said logic gate output comprising said pulse generator circuit output;
   wherein said pulse generator circuit generates a pulse at said output when a signal applied to said input transitions from a first signal level to a second signal level but not when said input transitions from said second signal level to said first level.

10. The circuit of claim 9 wherein said non-inverting delay element comprises an even number of serially coupled inverters.

11. The circuit of claim 9 wherein said delay element comprises an asymmetric delay element.

12. A pulse generator circuit having an input and an output comprising:
   a first inverter having an input comprising the input of said pulse generator circuit, said first inverter also having an output;
   a delay element having an input and an output, said delay element input coupled to said output of said first inverter;
   a first NOR gate having first and second inputs and an output, the first input of said first NOR gate coupled to the output of said delay element and the second input of said first NOR gate coupled to the input of said delay element;
   a second inverter having an input and an output, the input of said second inverter coupled to the output of said first NOR gate;
   a second NOR gate having first and second inputs and an output, the first input of said second NOR gate coupled to the output of said second inverter and the second input of said second NOR gate coupled to the input of said delay element;
   a third inverter having an input coupled to the output of said second NOR gate, said third inverter also having an output; and
   a NAND gate having first and second inputs and an output, the first input of said NAND gate coupled to the output of said third inverter and the second input of said third logic gate coupled to the input of said first inverter.

13. A pulse generator circuit comprising:
   a first delay element having an input and an output, said first delay element comprising a non-inverting, symmetric delay element;
   a first NAND gate having a first input coupled to the input of said first delay element, said first NAND gate also having a second input coupled to the output of said first delay element;
   a second delay element having an input and an output, said second delay element comprising an inverting, symmetric delay element, said second delay element having an input coupled to an output of said first NAND gate;
   a second NAND gate having a first input coupled to the input of said first delay element, said second NAND gate also having a second input coupled to an output of said second delay element;
   a third delay element having an input and an output, said third delay element comprising a non-inverting, symmetric delay element, said third delay element having an input coupled to an output of said second NAND gate; and
   a third NAND gate having a first input coupled to the input of said first delay element, said third NAND gate also having a second input coupled to an output of said third delay element.

* * * * *